(12) United States Patent
Yun et al.

(10) Patent No.: US 12,167,645 B2
(45) Date of Patent: Dec. 10, 2024

(54) DISPLAY DEVICE

(71) Applicant: LG Display Co., Ltd., Seoul (KR)

(72) Inventors: JeongGi Yun, Gimpo-si (KR);
Taehwan Kim, Goyang-si (KR);
Nam-Yong Kim, Goyang-si (KR);
Jonghan Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 643 days.

(21) Appl. No.: 17/462,967

(22) Filed: Aug. 31, 2021

(65) Prior Publication Data
US 2022/0085125 A1 Mar. 17, 2022

(30) Foreign Application Priority Data
Sep. 14, 2020 (KR) .................. 10-2020-0117650

(51) Int. Cl.
| | | |
|---|---|---|
| H01L 21/78 | (2006.01) | |
| H10K 59/122 | (2023.01) | |
| H10K 59/124 | (2023.01) | |
| H10K 59/35 | (2023.01) | |

(52) U.S. Cl.
CPC ......... *H10K 59/124* (2023.02); *H10K 59/122* (2023.02); *H10K 59/353* (2023.02)

(58) Field of Classification Search
CPC .............. H10K 59/124; H10K 59/122; H10K 59/353; H10K 50/824; H10K 59/131; H10K 59/352; H10K 59/351; H10K 59/35; H10K 59/12
USPC .......................................................... 257/40
See application file for complete search history.

(56) References Cited

U.S. PATENT DOCUMENTS

| | | | | |
|---|---|---|---|---|
| 9,666,645 B2* | 5/2017 | Yata | ..................... | H10K 59/353 |
| 9,806,279 B2* | 10/2017 | Im | ..................... | H10K 59/1315 |
| 10,205,122 B2* | 2/2019 | Choi | ..................... | H10K 59/124 |
| 10,325,970 B2* | 6/2019 | Bang | ..................... | H10K 59/122 |
| 10,886,505 B2* | 1/2021 | Han | ..................... | H10K 71/00 |
| 10,978,672 B2* | 4/2021 | Lee | ..................... | H10K 59/12 |
| 11,296,167 B2* | 4/2022 | Koo | ..................... | H10K 59/12 |
| 11,355,728 B2* | 6/2022 | Kim | ..................... | H10K 59/873 |
| 11,387,432 B2* | 7/2022 | Lee | ..................... | H10K 50/844 |

(Continued)

FOREIGN PATENT DOCUMENTS

| | | |
|---|---|---|
| KR | 10-2016-0016339 A | 2/2016 |
| KR | 10-2017-0015829 A | 2/2017 |

*Primary Examiner* — Vu A Vu
(74) *Attorney, Agent, or Firm* — Birch, Stewart, Kolasch & Birch, LLP

(57) ABSTRACT

A display device according to an example of the present disclosure includes a substrate in which an emission area and a non-emission area are divided and a plurality of sub-pixels are defined, an insulating layer disposed on the substrate, a first electrode disposed in each of the plurality of sub-pixels, a bank disposed on the insulating layer and exposing the first electrode through an opening thereof, an organic layer disposed on the first electrode, and a second electrode disposed on the organic layer. The bank includes exposed side surfaces by removing one area thereof between the plurality of sub-pixels, an undercut structure inwardly from lower ends of the exposed side surfaces. The bank further includes exposed side surfaces by removing an area thereof between the plurality of sub-pixels, and a trench structure by removing a portion of a thickness of the insulating layer.

20 Claims, 15 Drawing Sheets

(56) References Cited

U.S. PATENT DOCUMENTS

| | | | |
|---|---|---|---|
| 11,925,054 B2* | 3/2024 | Lee | H10K 59/40 |
| 2017/0317154 A1* | 11/2017 | Heo | H10K 59/1315 |
| 2019/0115403 A1* | 4/2019 | Kang | H10K 50/81 |
| 2019/0189717 A1* | 6/2019 | Choi | H10K 71/00 |

* cited by examiner

DISPLAY DEVICE

CROSS-REFERENCE TO RELATED APPLICATIONS

This application claims the benefit of and priority to Korean Patent Application No. 10-2020-0117650 filed on Sep. 14, 2020 in the Republic of Korea, the entirety of which is hereby expressly incorporated herein by reference into the present application.

BACKGROUND

Technical Field

The present disclosure relates to a display device, and more particularly, to a display device capable of minimizing light emission by a leakage current.

Discussion of the Related Art

Recently, as our society advances toward an information-oriented society, the field of display devices for visually expressing an electrical information signal has rapidly advanced. Various display devices having excellent performance in terms of thinness, lightness, and low power consumption, are being developed correspondingly.

Among these various display devices, an organic light emitting display device is a self-light emitting display device, and can be manufactured to be light and thin since it does not require a separate light source, unlike a liquid crystal display device having a separate light source. In addition, the organic light emitting display device has advantages in terms of power consumption due to a low driving voltage, and is excellent in terms of a color implementation, a response speed, a viewing angle, and a contrast ratio (CR). Therefore, organic light emitting display devices have been studied as the next generation displays.

SUMMARY OF THE INVENTION

An aspect of the present disclosure is to provide a display device to which a multi-stack structure using stacking of a plurality of light emitting units is applied in order to realize improved efficiency and lifespan characteristics.

Another aspect of the present disclosure is to provide a display device capable of minimizing a phenomenon in which some of a plurality of light emitting elements having a common layer emit light due to a leakage current.

Still another aspect of the present disclosure is to provide a display device capable of preventing a leakage current and at the same time, preventing the occurrence of a bluish color.

Objects of the present disclosure are not limited to the above-mentioned objects, and other objects, which are not mentioned above, can be clearly understood by those skilled in the art from the following descriptions.

A display device according to an exemplary embodiment of the present disclosure includes a substrate in which an emission area and a non-emission area are divided and a plurality of sub-pixels are defined; an insulating layer disposed on the substrate; a first electrode disposed in each of the plurality of sub-pixels; a bank disposed on the insulating layer and exposing the first electrode through an opening thereof; an organic layer disposed on the first electrode; and a second electrode disposed on the organic layer, wherein the bank has exposed side surfaces by removing one area thereof between the plurality of sub-pixels and has an undercut structure inwardly from lower ends of the exposed side surfaces, wherein the bank has exposed side surfaces by removing an area thereof between the plurality of sub-pixels and has a trench structure by removing a portion of a thickness of the insulating layer.

Other detailed matters of the exemplary embodiments are included in the detailed description and the drawings.

According to the present disclosure, high efficiency can be exhibited by applying an organic light emitting element having a multi-stack structure, and a low driving current can be allowed to thereby increase a lifespan of the organic light emitting element.

According to the present disclosure, current leakage can be prevented or minimized through a common layer of a plurality of light emitting elements.

According to the present disclosure, unintended light emission of a light emitting element can be minimized and a bluish color occurrence can be prevented, thereby improving color reproducibility.

The effects according to the present disclosure are not limited to the contents exemplified above and below, and more various effects are included in the present specification.

BRIEF DESCRIPTION OF THE DRAWINGS

The embodiments of the present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
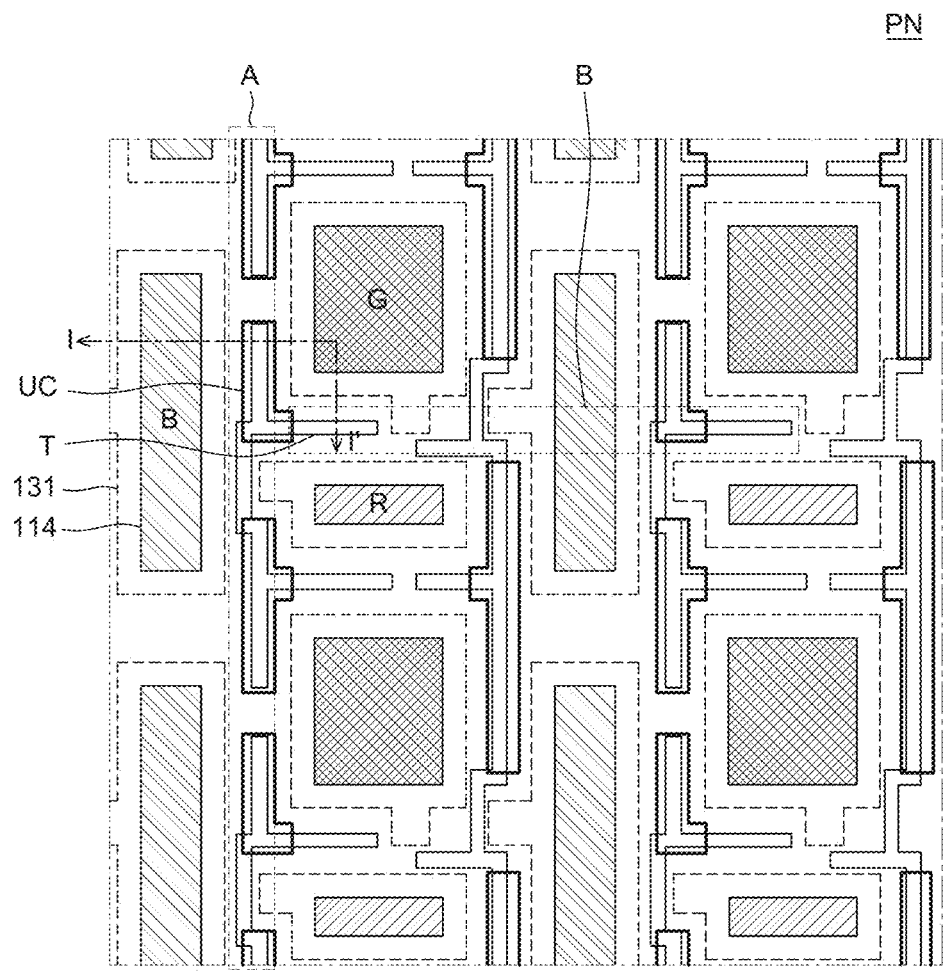
FIG. 1 is an enlarged plan view of sub-pixels of a display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

FIG. 1 is an enlarged plan view of sub-pixels of a display device according to a first exemplary embodiment of the present disclosure.

Figure 2:
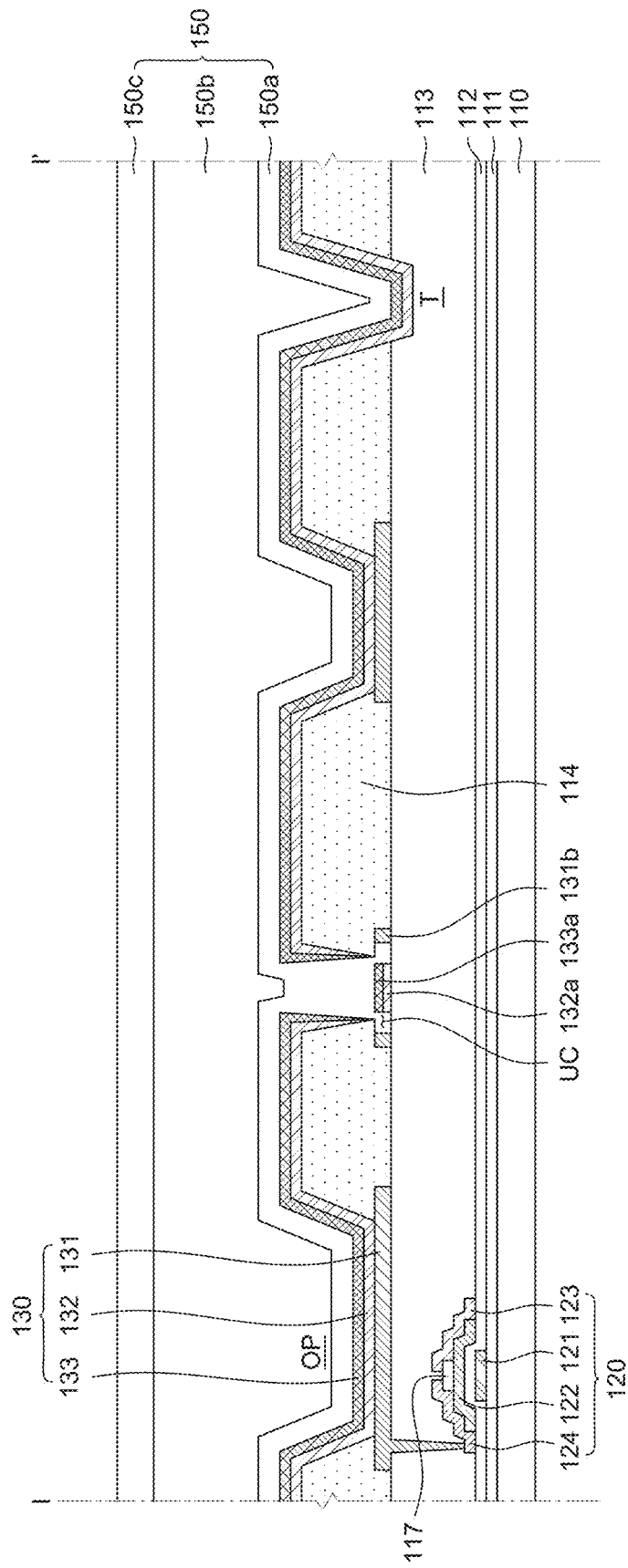
FIG. 2 is a cross-sectional view taken along line I-I' of FIG. 1.

FIG. 2 is a cross-sectional view taken along line I-I' of FIG. 1.

FIG. 1 illustrates a case in which shapes of sub-pixels R, G, and B are rectangles as an example, but the present disclosure is not limited thereto. FIG. 2 illustrates inclusion of any one transistor 120 in a cross-sectional structure of FIG. 1. For example, in FIG. 2, only one transistor 120 among a plurality of transistors and capacitors of a pixel circuit of one sub-pixel R, G or B is illustrated for convenience of description. In addition, FIG. 2 illustrates a cross-section cut across any two sub-pixels G and B in a horizontal direction and a cross-section cut across any two sub-pixels R and G in a vertical direction, together.

In one or more embodiments of the present disclosure, A display device can include a display panel PN that includes a plurality of sub-pixels R, G, and B, a gate driver and a data driver that supply various signals to the display panel PN, and a timing controller that controls the gate driver and the data driver. The sub-pixels can also have different combinations of subpixels such as R (red), G (green), B (blue) and W (white).

Referring to the example of FIGS. 1 and 2, the display panel PN according to the first exemplary embodiment of the present disclosure can include a substrate 110, the transistor 120, light emitting elements 130, banks 114, and an encapsulation part 150. The display device can be implemented as a top emission type display device, but is not limited thereto.

The display panel PN, a component for displaying an image to a user, can include the plurality of sub-pixels R, G, and B. In the display panel PN, a plurality of scan lines and a plurality of data lines cross each other, and each of the plurality of sub-pixels R, G, and B can be connected to the scan line and the data line. In addition, each of the plurality of sub-pixels R, G, and B can be connected to a high-potential power line, a low potential power line, an initialization signal line, an emission control signal line, and the like.

The sub-pixel R, G or B is a minimum unit that constitutes a screen of the display panel PN, and each of the plurality of sub-pixels R, G, and B can include the light emitting element 130 and a pixel circuit for driving the light emitting element 130.

A plurality of the light emitting elements 130 can be defined differently depending on a type of the display panel PN. For example, when the display panel PN is an organic light emitting display panel, the light emitting element 130 can be an organic light emitting element including a first electrode 131, an organic layer 132, and a second electrode 133. Hereinafter, a description is made assuming that the light emitting element 130 is an organic light emitting element, but the present disclosure is not limited thereto.

The pixel circuit is a circuit for controlling driving of the light emitting element 130. The pixel circuit can include, for example, a plurality of transistors 120 and capacitors, but is not limited thereto.

The plurality of sub-pixels R, G, and B are individual units that emit light, and the light emitting element 130 can be disposed in each of the plurality of sub-pixels R, G, and B. The plurality of sub-pixels R, G, and B can include first sub-pixels R, second sub-pixels G, and third sub-pixels B that emit light of different colors, but are not limited thereto. For example, the first sub-pixel R can be a blue sub-pixel, the second sub-pixel G can be a green sub-pixel, and the third sub-pixel B can be a red sub-pixel, but the present disclosure is not limited thereto.

Areas of the plurality of sub-pixels R, G, and B can be defined by the banks 114. For example, the banks 114 can be disposed to partially cover the planarization layer 113 and the first electrodes 131 of the light emitting elements 130 in the plurality of sub-pixels R, G, and B. The substrate 110 can be divided into an emission area and a non-emission area. For example, in the non-emission area, the bank 114 can be disposed on the first electrode 131 to block light generation in the non-emission area. On the other hand, the bank 114 is not disposed in the emission area, and the organic layer 132 can be directly positioned on the first electrode 131, so that light can be generated from the organic layer 132.

Meanwhile, the present disclosure is characterized in that an undercut UC structure and a trench T structure are disposed together between the plurality of sub-pixels R, G, and B. For example, the undercut UC structure can be disposed to prevent the light emitting element 130 from emitting light due to a leakage current, and the trench T structure can be disposed to prevent a bluish color due to a decrease in luminance.

In the undercut UC structure, the bank 114 is removed to thereby expose side surfaces of the bank 114, and the bank 114 is further removed by a predetermined distance inwardly from lower ends of the exposed side surfaces of the bank 114, whereby an undercut UC can be formed.

In the first exemplary embodiment of the present disclosure, a conductive pattern 131b that is formed of a conductive layer of the first electrode 131 remains inside the undercut UC, but the present disclosure is not limited thereto.

In the undercut UC structure, the organic layer 132 and the second electrode 133 of the light emitting element 130 to be formed later are disconnected due to steep inclined angles of the exposed side surfaces of the bank 114 and the undercut UC structure. At this time, within the undercut UC structure, an organic layer pattern 132a and a second electrode pattern 133a are stacked on each other, and each of the organic layer pattern 132a and the second electrode pattern 133a are not connected to the organic layer 132 and the second electrode 133 and are disconnected therefrom.

On the other hand, in the trench T structure, a trench T can be formed in the planarization layer 113 by removing the lower planarization layer 113 by a partial thickness, together with removing the bank 114.

In the trench T structure, the undercut UC does not exist, so that each of the organic layer 132 and the second electrode 133 of the light emitting element 130 can be connected without being broken. However, a leakage current path is lengthened due to the patterning of the bank 114 and the trench T formed in the planarization layer 113, so that effects of the leakage current can be reduced.

Referring to FIG. 1, for example, a plurality of the third sub-pixels B can be disposed in the same column, and a plurality of the first sub-pixels R and second sub-pixels G can be alternately disposed in the same column.

More specifically, the plurality of third sub-pixels B can be disposed in a first column and a third column, and the plurality of first sub-pixels R and second sub-pixels G can be alternately disposed in a second column and a fourth column. However, the present disclosure is not limited thereto.

In addition, for example, the first sub-pixel R and the second sub-pixel G can be disposed on a left and a right of the third sub-pixel B, but are not limited thereto.

Thus, the plurality of third sub-pixels B and the plurality of first and second sub-pixels R and G can be alternately disposed in a horizontal direction, and the plurality of third sub-pixels B can be repeatedly disposed or the plurality of first sub-pixels R and the plurality of second sub-pixels G can be alternately disposed in a vertical direction. In this case, the undercut UC structure can be disposed in the vertical direction between the plurality of sub-pixels R, G and B and at the same time, the trench T structure can be disposed in the horizontal direction between the plurality of sub-pixels R, G and B. For example, the undercut UC structure can be disposed in the vertical direction between the plurality of third sub-pixels B and the plurality of first and second sub-pixels R and G (refer to FIG. 3A), and at the same time, the trench T structure can be disposed in the horizontal direction between the plurality of first sub-pixels R and the plurality of second sub-pixels G (refer to FIG. 3B). However, the present disclosure is not limited thereto.

For example, the trench T structure can be formed to extend in the horizontal direction from the undercut UC structure disposed in the vertical direction, but is not limited thereto.

The undercut UC structure can be divided into a plurality of undercut structures, but is not limited thereto.

The trench T structure can be formed in the vertical direction between the plurality of divided undercut UC structures in the vertical direction, but is not limited thereto.

The undercut UC structure of the present disclosure can effectively block a lateral leakage current occurring in a multi-stack structure, for example. For example, due to the undercut UC structure of the present disclosure, the organic layer 132 and the second electrode 133 between the sub-pixels R, G, and B that are adjacent to one another can be disconnected from each other. However, the present disclosure is not limited to a multi-stack structure, and can be effectively applied to cases in which a side leakage current occurs in a general organic light emitting display device.

In this case, the meaning that the organic layer 132 and the second electrode 133 between the adjacent sub-pixels R, G, and B are disconnected from each other implies that they are disconnected from each other only in an area where the undercut UC structure is disposed. In areas other than the area, the organic layer 132 and the second electrode 133 are connected to each other.

In addition, the present disclosure is more effective in blocking a leakage current that can occur because of the use of a common layer due to a process characteristic of an organic light emitting display device, particularly, in blocking a leakage current that is generated by a strong current path mainly formed in a low gradation region.

In addition, in the present disclosure, it is possible to solve or address the problem of causing a bluish color due to a decrease in luminance as well as blocking a leakage current. For example, the present disclosure blocks a side leakage current between the plurality of third sub-pixels B and the plurality of first and second sub-pixels R and G through the undercut UC structure, and in the meantime, lengthens current paths between the plurality of first sub-pixels R and the plurality of second sub-pixels G while connecting the second electrode 133 to thereby compensate for a bluish color. For example, since a low potential voltage of the second electrode 133 is more affected by sheet resistance in the horizontal direction compared to sheet resistance in the vertical direction, the trench T structure can be formed so that the current path between the first sub-pixel R and the second sub-pixel G lengthens and at the same time, the second electrode 133 is not disconnected. This will be described in detail later.

The trench T structure can be patterned together with the undercut UC structure.

Referring to FIG. 2, the substrate 110, a support member for supporting other components of the display device, can be formed of an insulating material.

For example, the substrate 110 can be formed of glass or resin. Further, the substrate 110 can be formed of a polymer or plastic such as polyimide (PI), or can be formed of a material having flexibility.

A buffer layer 111 can be disposed on the substrate 110. The buffer layer 111 can reduce penetration of moisture or impurities through the substrate 110. The buffer layer 111 can be formed of, for example, a single layer or multiple layers of silicon oxide (SiOx) or silicon nitride (SiNx), but is not limited thereto. However, the buffer layer 111 can be omitted depending on a type of the substrate 110 or a type of the transistor, but is not limited thereto.

The transistor 120 can be disposed on the buffer layer 111. The transistor 120 can include a gate electrode 121, an active layer 122, a source electrode 123, and a drain electrode 124.

The transistor 120 shown in FIG. 2 is a transistor having a bottom gate structure in which the active layer 122 is disposed on the gate electrode 121 and the source electrode 123 and the drain electrode 124 are disposed on the active layer 122, but the present disclosure is not limited thereto.

The gate electrode 121 can be disposed on the buffer layer 111.

The gate electrode 121 can be formed of a conductive material, for example, copper (Cu), aluminum (Al), molybdenum (Mo), nickel (Ni), titanium (Ti), chromium (Cr), or an alloy thereof, but is not limited thereto.

A gate insulating layer 112 can be disposed on the gate electrode 121.

The gate insulating layer 112, an insulating layer for insulating the active layer 122 and the gate electrode 121, can be configured of a single layer or multiple layers of silicon oxide (SiOx) or silicon nitride (SiNx), but is not limited thereto.

The active layer 122 can be disposed on the gate insulating layer 112.

The active layer 122 can be formed of a semiconductor material such as an oxide semiconductor, amorphous silicon, or polysilicon, but is not limited thereto. For example, when the active layer 122 is formed of an oxide semiconductor, the active layer 122 can be formed of a channel region, a source region, and a drain region, and the source region and the drain region can be conductive regions, but are not limited thereto.

An etch stopper 117 can be disposed on the active layer 122. When patterning the source electrode 123 and the drain electrode 124 by an etching method, the etch stopper 117 can be additionally formed to prevent damage to a surface of the active layer 122 due to plasma. One end of the etch stopper 117 can overlap the source electrode 123 and the other end of the etch stopper 117 can overlap the drain electrode 124. However, the etch stopper 117 can be omitted.

The source electrode 123 and the drain electrode 124 can be disposed on the active layer 122 and the etch stopper 117. The source electrode 123 and the drain electrode 124 that are disposed to be spaced apart from each other can be electrically connected to the active layer 122. The source electrode 123 and the drain electrode 124 can be formed of a conductive material, for example, copper (Cu), aluminum (Al), molybdenum (Mo), nickel (Ni), titanium (Ti), chromium (Cr), or an alloy thereof, but is not limited thereto.

A planarization layer 113 can be disposed on the transistor 120. The planarization layer 113 is an insulating layer that flattens an upper portion of the substrate 110. The planarization layer 113 can be formed of an organic material, and can be configured of a single layer or multiple layers of, for example, polyimide or photoacryl, but it is not limited thereto.

The light emitting element 130 can be disposed in each of the plurality of sub-pixels R, G, and B on the planarization layer 113. The light emitting element 130 can include the first electrode 131, the organic layer 132, and the second electrode 133. The organic layer 132 can be configured of an emission layer that is disposed in the emission area and a common layer that is disposed on an entire surface of the substrate 110 including the emission area and the non-emission area, but it is not limited thereto.

The first electrode 131 can be disposed on the planarization layer 113.

The first electrode 131 can be electrically connected to the transistor 120 and receive a driving current of the pixel circuit. Since the first electrode 131 supplies holes to the emission layer, it can be formed of a conductive material having a high work function. The first electrode 131 can be formed of, for example, a transparent conductive material such as indium tin oxide (ITO) or indium zinc oxide (IZO), but is not limited thereto.

The display device can be implemented in a top emission method or bottom emission method. In the case of a top emission method, a metallic material having excellent reflection efficiency, for example, a reflective layer formed of a material such as aluminum (Al) or silver (Ag), can be added under the first electrode 131 so that light emitted from the emission layer is reflected onto the first electrode 131 and directed upwardly, for example, toward the second electrode 133. On the other hand, when the display device is a bottom emission type, the first electrode 131 can be formed of only a transparent conductive material. Hereinafter, a description will be made on the assumption that the display device according to an exemplary embodiment is a top emission type, but the present disclosure is not limited thereto.

The first electrode 131 can be formed in a stacked structure of two or more layers including, for example, a reflective layer.

The organic layer 132 can be disposed between the first electrode 131 and the second electrode 133.

The organic layer 132 is a region where light is emitted by a combination of electrons and holes that are supplied from the first electrode 131 and the second electrode 133.

Meanwhile, in order to improve quality and productivity of an organic light emitting display device, various organic light emitting element structures have been proposed to improve the efficiency and lifespan of the organic light emitting element and reduce power consumption thereof.

Accordingly, as well as an organic light emitting element to which one stack, for example, one electroluminescence (EL) unit is applied, the organic light emitting element 130 having a tandem structure in which a plurality of stacks, for example, stacking of a plurality of light emitting units are used to realize improved efficiency and lifespan characteristics, have been suggested. Although the present disclosure is not limited to the tandem structure, hereinafter, the tandem structure will be described as an example for convenience.

In the organic light emitting element 130 of the tandem structure, for example, a two-stack structure using stacking of a first light emitting unit and a second light emitting unit, an emission area where light is emitted by recombination of electrons and holes is positioned in each of the first light emitting unit and the second light emitting unit, and light emitted from a first emission layer of the first emission unit and light emitted from a second emission layer of the second emission unit can respectively cause constructive interference, so that the organic light emitting element 130 of the two-stack structure can provide high luminance as compared to the organic light emitting element 130 of a single stack structure.

The stack structure can include, for example, a charge generation layer disposed between the first electrode 131 and the second electrode 133, a first stack disposed between the charge generation layer and the first electrode 131, and a second stack disposed between the second electrode 133 and the charge generation layer. The charge generation layer can be disposed between the first stack and the second stack to generate charges. The charge generation layer can be formed in a structure in which a p-type charge generation layer and an n-type charge generation layer are stacked. For example, the charge generation layer can be configured of a p-type charge generation layer and an n-type charge generation layer that generate positive charges and negative charges in both directions, and can substantially serve as electrodes.

Each of the first stack and the second stack includes at least one emission layer, and can include common layers above and below the emission layer with each emission layer interposed therebetween.

In addition, distances between the plurality of sub-pixels R, G and B constituting one pixel in the organic light emitting element 130 decrease as the organic light emitting display device is higher in resolution. Auxiliary organic layers such as a hole injection layer EIL, a hole transport layer HTL, a charge generation layer CGL, an electron injection layer EIL, an electron transport layer ETL, and the like, except for the emission layer EML, are deposited to correspond to all of the plurality of sub-pixels R, G and B using a common mask and are formed as common layers, and the emission layers in the plurality of sub-pixels R, G and B that respectively generate light of different wavelength can be individually deposited and formed to correspond to the respective sub-pixels R, G, and B, with the use of a fine mask.

In the case of the organic light emitting elements 130 as described above, when a voltage is applied between the first electrode 131 and the second electrode 133, a lateral leakage current is generated in a lateral direction of the organic light emitting elements 130 through the common layer formed in the organic light emitting elements 130. Accordingly, a color mixing defect occurs as not only the sub-pixels R, G and B where light emission is required, but also unwanted sub-pixels R, G and B located adjacent thereto emit light.

The above-described color mixing defect can be more severe in the organic light emitting element 130 of the two-stack structure using the staking of the first light emitting unit and the second light emitting unit which uses constructive interference of light, compared to the organic light emitting element of the single stack structure.

Accordingly, in the present disclosure, the undercut UC structure is formed between the plurality of sub-pixels R, G and B so that the organic layer 132 and the second electrode 133 between the adjacent sub-pixels R, G and B is partially disconnected, and a current path increases through the trench T structure, thereby minimizing a leakage current, particularly when driving a display device having a multi-stack structure. The present disclosure, for example, forms the undercut UC structure between the plurality of third sub-pixels B and the plurality of first and second sub-pixels R and G, and forms the trench T structure between the first sub-pixel R and the second sub-pixel G.

In the undercut UC structure, the bank 114 is removed to thereby expose side surfaces of the bank 114, and the bank 114 is further removed by a predetermined distance inwardly from lower ends of the exposed side surfaces of the bank 114, whereby the undercut UC can be formed.

In the first exemplary embodiment of the present disclosure, the conductive pattern 131b that is formed of a conductive layer of the first electrode 131 remains inside the undercut UC, but the present disclosure is not limited thereto.

Within the undercut UC structure, the organic layer pattern 132a and the second electrode pattern 133a are stacked on each other, and each of the organic layer pattern 132a and the second electrode pattern 133a are not connected to the organic layer 132 and the second electrode 133 and are disconnected therefrom.

In addition, at high luminance, a bluish color difference (27%) can occur due to a decrease in luminance of red and green compared to blue. In a case of the undercut UC structure, luminance is lowered due to an increase in resistance of the second electrode 133, as compared to a case without the undercut UC structure. In particular, a bluish color can occur due to the decrease in luminance of red and green compared to blue. Accordingly, the trench T structure can be formed between the first sub-pixel R and the second sub-pixel G instead of the undercut UC structure so that the second electrode 133 is not disconnected. For example, if the connection of the second electrode 133 is completely blocked between the red first sub-pixel R and the green second sub-pixel G, a bluish color issue can occur. When disposing the trench T structure, instead of disposing the undercut UC structure in the horizontal direction, a rising of a low potential voltage can be prevented by the connection of the second electrode 133. For reference, a low potential voltage deviation (max–Min) of the second electrode 133 according to sheet resistance is more affected by sheet resistance in the horizontal direction compared to sheet resistance in the vertical direction.

In this case, in the trench T structure, the trench T can be formed in the planarization layer 113 by removing the lower planarization layer 113 by a partial thickness, together with removing the bank 114.

The trench T structure can be patterned together with the undercut UC structure.

For example, when patterning the first electrode 131, a conductive layer pattern is additionally formed between the plurality of third sub-pixels B and the plurality of first and second sub-pixels R and G.

Thereafter, the bank 114 is formed on the first electrode 131 and the planarization layer 113.

Next, when the bank 114 on the conductive layer pattern is removed, a surface of the conductive layer pattern is exposed.

At the same time, the bank 114 between the first sub-pixel R and the second sub-pixel G is also removed to expose a surface of the planarization layer 113.

Dry etch can be used to remove the bank 114, but the present disclosure is not limited thereto.

Next, wet etch is performed to remove the conductive layer pattern, so that the undercut UC is formed in lower portions of the exposed side surfaces of the bank 114. At the same time, the trench T is formed in the planarization layer 113 as a partial thickness of the planarization layer 113 which is exposed between the first sub-pixel R and the second sub-pixel G is removed.

At this time, the conductive pattern 131b formed of a conductive layer of the first electrode 131 remains inside the undercut UC, but the present disclosure is not limited thereto.

Referring back to FIG. 2, the bank 114 can be disposed on the first electrode 131 and the planarization layer 113. The bank 114 is an insulating layer disposed between the plurality of sub-pixels R, G, and B to distinguish the plurality of sub-pixels R, G, and B.

The bank 114 can include an opening OP that exposes a portion of the first electrode 131. The bank 114 can be formed of an organic insulating material that is disposed to cover an edge or a corner portion of the first electrode 131. The bank 114 can be formed of, for example, polyimide, acrylic, or benzocyclobutene (BCB)-based resin, but is not limited thereto.

A plurality of spacers can be disposed on the bank 114 in the non-emission area. For example, when forming the light emitting element 130, the spacer can be disposed on the bank 114 in the non-emission area to maintain a predetermined distance from a deposition mask. By the spacer, the bank 114 and the first electrode 131 under the spacer can maintain a predetermined distance from the deposition mask, and damage due to contact between the deposition mask and the bank 114 can be prevented. In this case, the plurality of spacers can be formed in a form that a width thereof is reduced upwardly, for example, in a tapered shape, so as to minimize an area in contact with the deposition mask, but the present disclosure is not limited thereto.

The organic layer 132 can be disposed on the first electrode 131. The organic layer 132 can include an emission layer disposed in each of the plurality of sub-pixels R, G, and B, and a common layer commonly disposed in the plurality of sub-pixels R, G, and B, but the present disclosure is not limited thereto. The emission layer is an organic layer for emitting light of a specific color, and different emission layers can be disposed in each of the first sub-pixel R, the second sub-pixel G, and the third sub-pixel B. However, the present disclosure is not limited thereto, and a plurality of emission layers can be provided in each of the sub-pixels R, G, and B to emit white light.

The common layer is an organic layer disposed to improve luminous efficiency of the emission layer. The common layer can be formed as one layer throughout the plurality of sub-pixels R, G, and B. For example, common layers of the plurality of respective sub-pixels R, G, and B can be connected to each other and formed integrally. The common layer can include a hole injection layer, a hole transport layer, an electron transport layer, an electron injection layer, a charge generation layer, and the like but is not limited thereto.

The second electrode 133 can be disposed on the organic layer 132.

The second electrode 133 is an electrode that supplies electrons to the organic light emitting element 130 according to the first exemplary embodiment of the present disclosure. The second electrode 133 can be formed of a material having a low work function. The second electrode 133 can include a transparent conductive material. For example, the second electrode 133 can be formed of indium tin oxide (ITO), indium zinc oxide (IZO), indium gallium zinc oxide (IGZO), or the like. Alternatively, the second electrode 133 can include any one of the group consisting of a metallic material such as gold (Au), silver (Ag), aluminum (Al), molybdenum (Mo), magnesium (Mg), palladium (Pd), copper (Cu) or the like, or alloys thereof. For example, the second electrode 133 can be formed of an alloy of magnesium (Mg) and silver (Ag). Alternatively, the second electrode 133 can be configured by stacking a layer formed of a transparent conductive material such as indium tin oxide (ITO), indium zinc oxide (IZO) or indium gallium zinc oxide (IGZO) and a layer formed of a metallic material such as gold (Au), silver (Ag) aluminum (Al), molybdenum (Mo), magnesium (Mg), palladium (Pd), copper (Cu) or the like or an alloy thereof, but is not limited thereto.

The second electrode 133 can be electrically connected to a low potential power line and receive a low potential power signal.

The encapsulation part 150 can be disposed on the second electrode 133.

The encapsulation part 150 can be disposed over the bank 114 and the light emitting element 130.

The encapsulation part 150 can block oxygen and moisture penetrating into the display device from the outside. For example, when the display device is exposed to moisture or oxygen, a pixel shrinkage phenomenon in which the emission area is reduced can occur or black spots can occur in the emission area. Accordingly, the encapsulation part 150 can protect the display device by blocking oxygen and moisture.

The encapsulation part 150 can include a first encapsulation layer 150a, a second encapsulation layer 150b, and a third encapsulation layer 150c.

The first encapsulation layer 150a can be disposed on the second electrode 133 and suppress penetration of moisture or oxygen. The first encapsulation layer 150a can be formed of an inorganic material such as silicon nitride (SiNx), silicon oxynitride (SiNxOy), or aluminum oxide (AlyOz), but is not limited thereto.

The second encapsulation layer 150b can be disposed on the first encapsulation layer 150a and planarize the surface thereof. In addition, the second encapsulation layer 150b can cover foreign substances or particles that can occur during a manufacturing process of the display device. The second encapsulation layer 150b can be formed of an organic material, for example, silicon oxycarbon (SiOxCz), acrylic or epoxy-based resin, but is not limited thereto.

The third encapsulation layer 150c can be disposed on the second encapsulation layer 150b and suppress penetration of moisture or oxygen. The third encapsulation layer 150c can be formed of an inorganic material such as silicon nitride (SiNx), silicon oxynitride (SiNxOy), silicon oxide (SiOx), or aluminum oxide (AlyOz), but is not limited thereto.

Meanwhile, as described above, the common layer of the plurality of light emitting elements 130 can be formed as a single layer throughout the plurality of sub-pixels R, G, and B. At this time, as the light emitting elements 130 of the plurality of sub-pixels R, G, and B are formed in a structure in which they share a common layer, there can occur a phenomenon in which when the light emitting element 130 of a specific sub-pixel R, G or B emits light, a current flows to the light emitting elements 130 of sub-pixels R, G and B that are adjacent to the specific sub-pixel R, G or B, for example, a current leakage phenomenon. The current leakage phenomenon causes the light emitting elements 130 of unintended other sub-pixels to emit light, which can cause color mixing between the plurality of sub-pixels R, G, and B, and increase power consumption. In addition, color abnormalities and irregularities can be visually recognized due to a leakage current to thereby degrade display quality. For example, when only the first sub-pixel R among the plurality of sub-pixels R, G, and B emits light, a portion of a current that is supplied to drive the light emitting element 130 of the first sub-pixel R can leak to the second sub-pixel G and/or the third sub-pixel B adjacent to the first sub-pixel R through the common layer.

Accordingly, the display device of the present disclosure is characterized by minimizing a leakage current through the common layer of the light emitting element 130 by forming the undercut UC structure and the trench T structure between the plurality of sub-pixels R, G, and B as described above.

In addition, in the display device of the present disclosure, an inclined angle of the side surfaces of the bank 114 above the undercut UC structure is made relatively greater than an inclined angle of the side surfaces of the bank 114 in an area other than above the undercut UC structure, for example, in the emission area, so that the organic layer 132 and the second electrode 133 between the adjacent sub-pixels R, G, and B can be more effectively disconnected. This will be described in detail with reference to FIGS. 3A and 3B to FIG. 5.

Figure 3A:
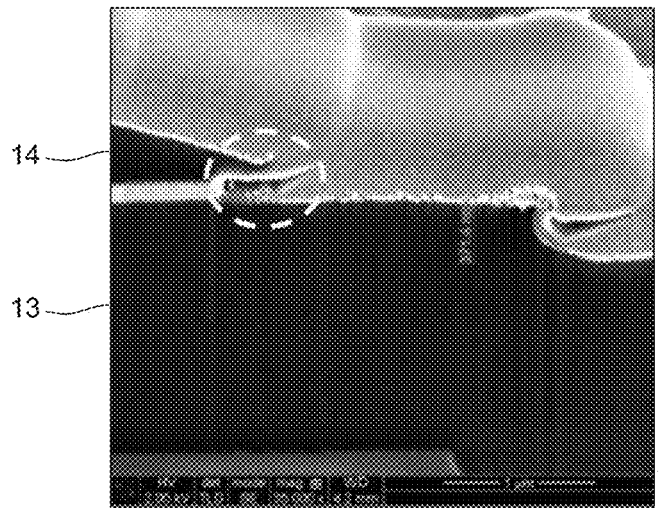
FIG. 3A and FIG. 3B are TEM (Transmission Electron Microscope) images each showing a bank according to a comparative example, as an example.
Figure 3B:
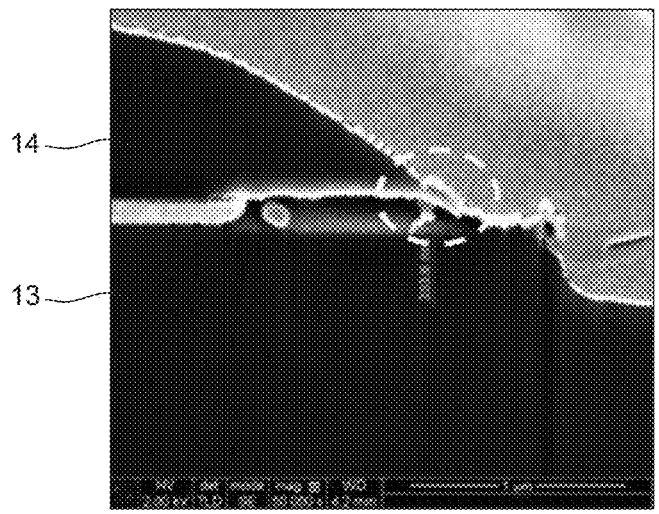

FIG. 3A and FIG. 3B are TEM images each showing a bank according to a comparative example, as an example.

Figure 4:
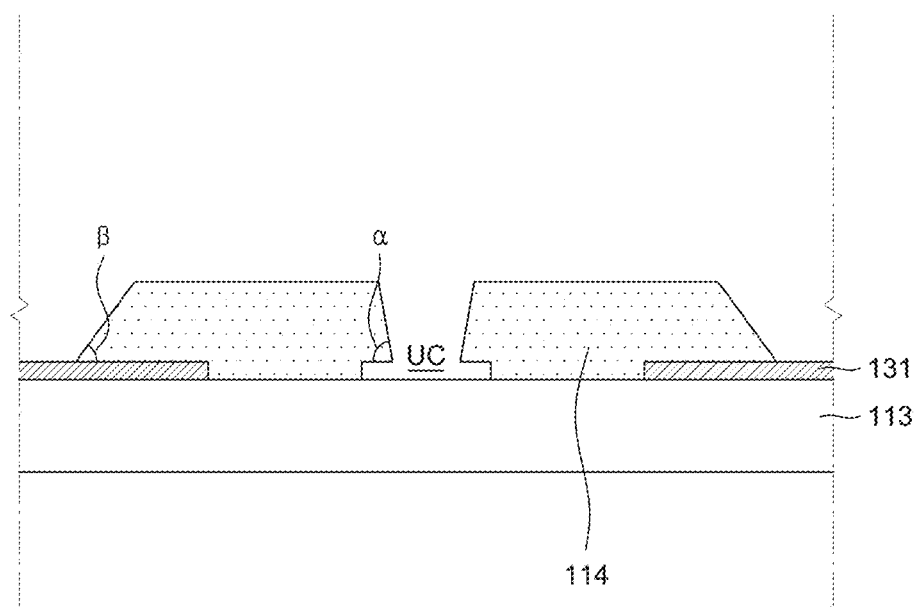
FIG. 4 is a cross-sectional view showing a taper of a bank according to the present disclosure as an example.

FIG. 4 is a cross-sectional view showing an inclined angle of the exposed side surfaces of a bank according to the present disclosure as an example.

Figure 5:
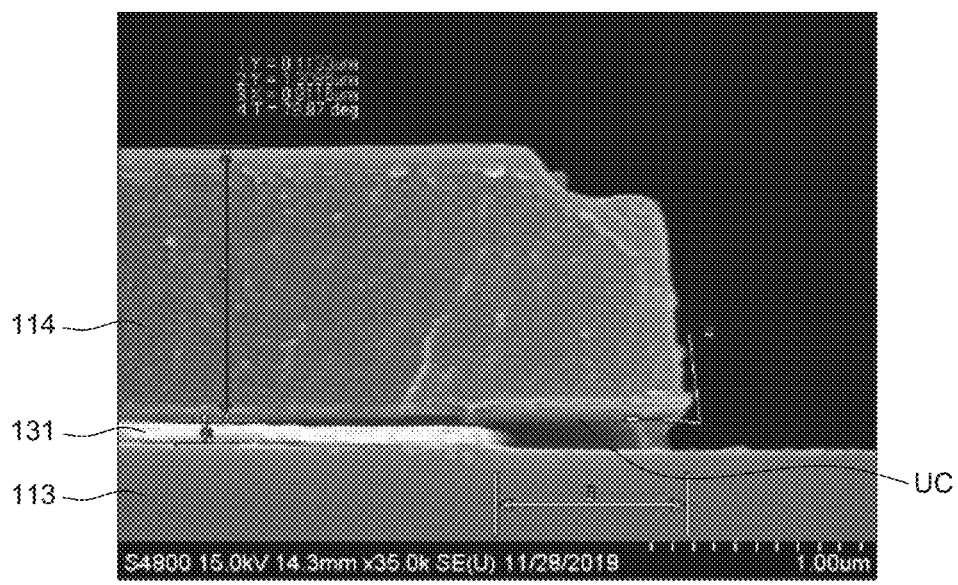
FIG. 5 is a TEM image showing the bank according to the present disclosure as an example.

FIG. 5 is a TEM image showing the bank according to the present disclosure as an example.

FIG. 3A and FIG. 3B show a TEM (Transmission Electron Microscope) image of a bank 14 above an undercut according to a comparative example in which an inclined angle of a side of the bank 14 is relatively low, and FIGS. 4 and 5 show TEM images of a bank 114 above an undercut UC according to an example of the present disclosure in which an inclined angle α of a side of the bank 114 is relatively high, for example, 75° or more. Here, the inclined angle α can be varied depending on various process conditions, and the present disclosure can be applied to a case in which the inclined angle α of the side of the bank 114 above the undercut UC has a relatively high angle compared to an inclined angle β of the side of the bank 114 in an emission area. For reference, in general, the inclined angle β of the side of the bank 114 in the emission area is 40° or less.

The comparative examples of FIG. 3A and FIG. 3B are a case in which the inclined angle of the side of the bank 14 above the undercut has the same or similar value to the inclined angle of the side of the bank 14 in the emission area.

In this case, as the inclined angle of the side of the bank 14 is lower, there can occur an issue in which an end thereof is lifted as shown in FIG. 3A or the end thereof sags as shown in FIG. 3B.

On the other hand, referring to FIGS. 4 and 5, when the inclined angle α of the side of the bank 114 above the undercut UC is relatively high, for example, 75° or more according to an example of the present disclosure, it can be confirmed that the undercut UC structure is stably formed without the issue of lifting or sagging the end.

For example, when a width of a conductive layer pattern for the undercut UC structure is about 6 μm and a width of the conductive layer pattern exposed by etching of the bank 114 is about 2.5 μm, an undercut UC structure of one side can be formed within about 1 μm, and a portion of the conductive pattern can remain inside the undercut UC. However, the present disclosure is not limited thereto, and the conductive pattern may not remain depending on process conditions.

Figure 6:
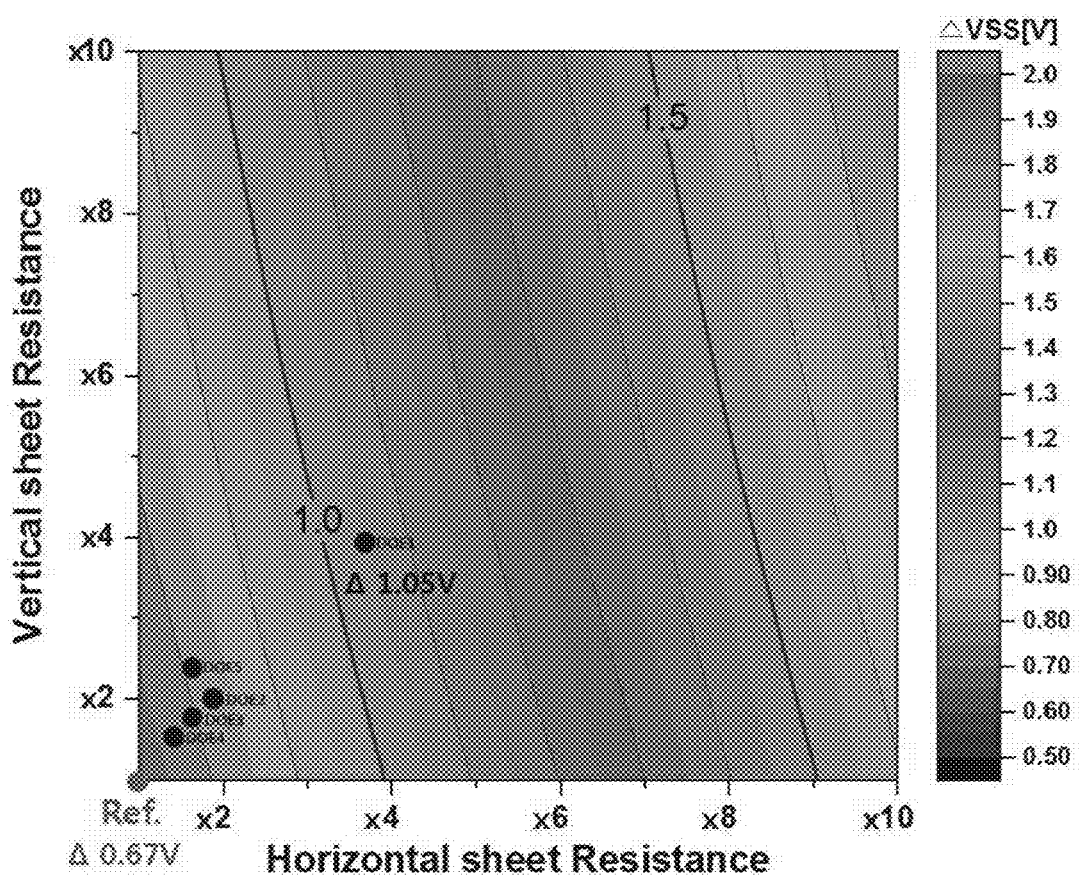
FIG. 6 is an image showing a difference in a low potential voltage according to sheet resistance.

FIG. 6 is an image showing a difference in a low potential voltage according to sheet resistance.

A horizontal axis of FIG. 6 represents a value of horizontal sheet resistance, and a vertical axis of FIG. 6 represents a value of vertical sheet resistance. It is shown that the low potential voltage deviation (max−Min) according to sheet resistance decreases toward blue from red.

Referring to FIG. 6, as the sheet resistance increases, the low potential voltage deviation (max−Min) increases. In particular, in the case of sheet resistance in a horizontal direction, it can be confirmed that the low potential voltage deviation (max−Min) increases very significantly as the sheet resistance increases.

For example, it can be confirmed that the low potential voltage deviation (max−Min) of the second electrode according to sheet resistance is more affected by the sheet resistance in the horizontal direction compared to the sheet resistance in the vertical direction.

Figure 7:
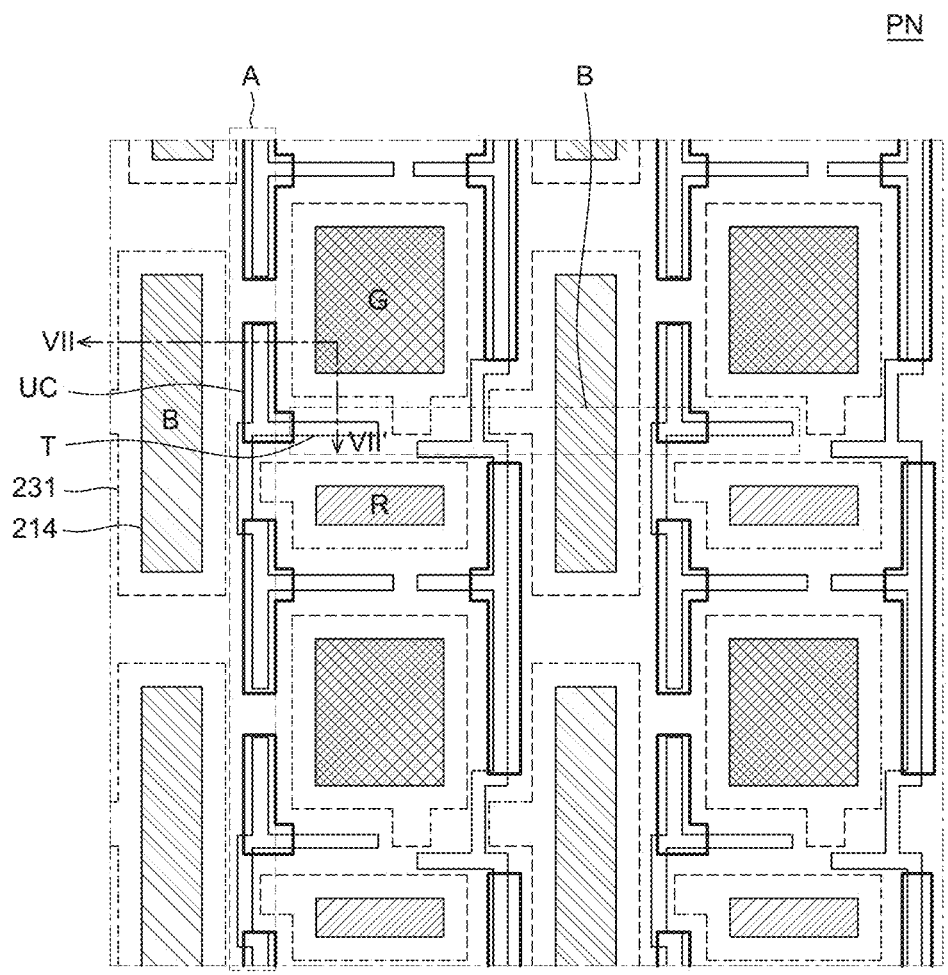
FIG. 7 is an enlarged plan view of sub-pixels of a display device according to a second exemplary embodiment of the present disclosure.

FIG. 7 is an enlarged plan view of sub-pixels of a display device according to a second exemplary embodiment of the present disclosure.

Figure 8:
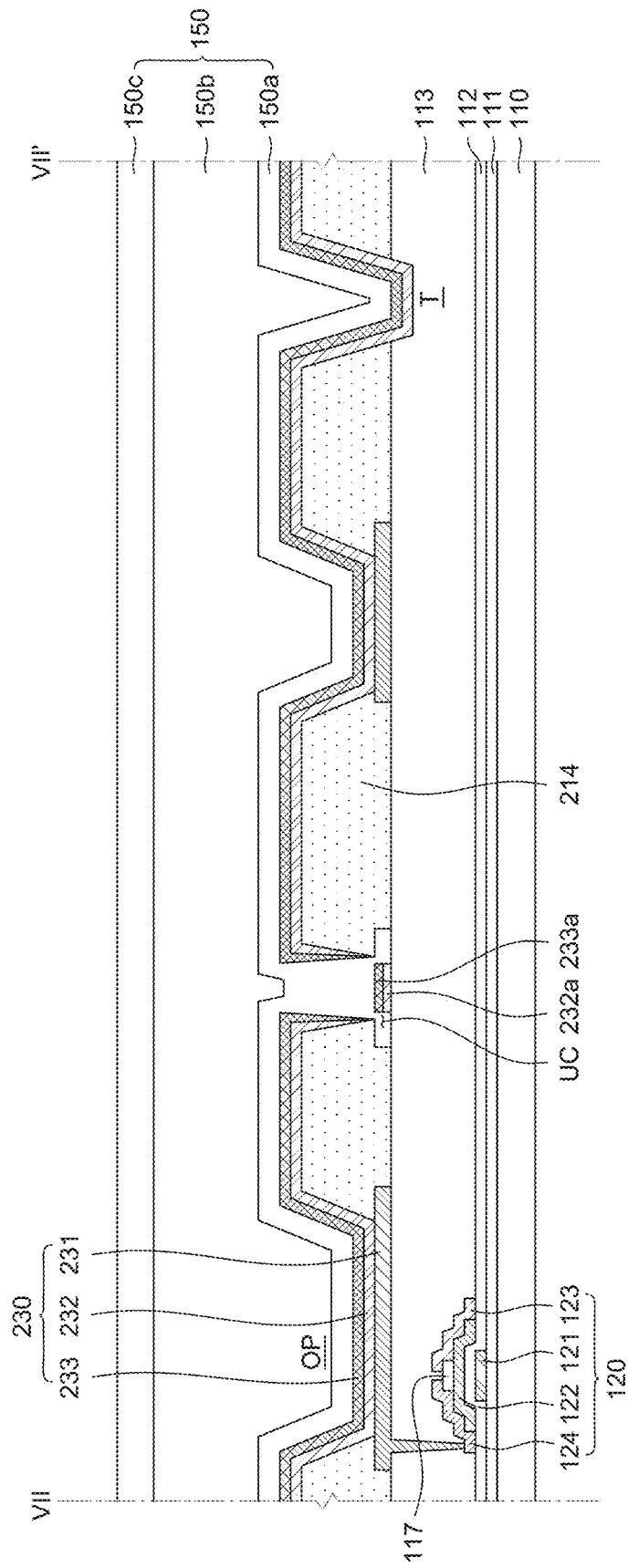
FIG. 8 is a cross-sectional view taken along line VII-VII' of FIG. 7.

FIG. 8 is a cross-sectional view taken along line VII-VII' of FIG. 7.

The second exemplary embodiment of the present disclosure shown in FIGS. 7 and 8 has substantially the same configuration as the first exemplary embodiment of the present disclosure, except that no conductive pattern remains inside the undercut UC. Therefore, redundant descriptions for the same configuration will be omitted or may be briefly provided.

FIG. 7 illustrates an example in which shapes of the sub-pixels R, G, and B are rectangles, but the present disclosure is not limited to the shapes of the sub-pixels R, G, and B. FIG. 8 illustrates inclusion of any one transistor 120 in a cross-sectional structure of FIG. 7. In addition, FIG. 8 illustrates a cross-section cut across any two sub-pixels G and B in a horizontal direction and a cross-section cut across any two sub-pixels R and G in a vertical direction.

Referring to FIGS. 7 and 8, a display panel PN according to the second exemplary embodiment of the present disclosure is characterized in that an undercut UC structure and a trench T structure are disposed together between the plurality of sub-pixels R, G, and B in the same manner as the aforementioned first exemplary embodiment of the present disclosure.

In the undercut UC structure, a bank 214 is removed to thereby expose side surfaces of the bank 214, and the bank 214 is further removed by a predetermined distance inwardly from lower ends of the exposed side surfaces of the bank 214, whereby an undercut UC can be formed.

In the second exemplary embodiment of the present disclosure, it is characterized in that a conductive pattern that is formed of a conductive layer of a first electrode 231 does not remain inside the undercut UC. Here, a case in which the conductive pattern remains inside the undercut UC and a case in which the conductive pattern does not remain inside the undercut UC can be determined by a difference in wet etch. For example, when a high viscosity phosphoric acid/nitric acid/acetic acid etch solution is used, silver (Ag) can be easily removed, so that the entirety of a conductive pattern including silver (Ag) can be removed.

If the conductive pattern does not remain inside the undercut UC, it is advantageous in that an unintended short circuit caused by the conductive pattern is prevented.

In the undercut UC structure, due to steep inclined angles of the exposed side surfaces of the bank 214 and the undercut UC structure, an organic layer pattern 232a and a second electrode pattern 233a are stacked on each other within the undercut UC structure, and each of the organic layer pattern 232a and the second electrode pattern 233a are not connected to an organic layer 232 and a second electrode 233 and are disconnected therefrom.

On the other hand, in the trench T structure, a trench T can be formed in the planarization layer 113 by removing the lower planarization layer 113 by a partial thickness, together with removing the bank 214.

In the trench T structure, the undercut UC does not exist, so that each of the organic layer 232 and the second electrode 233 of a light emitting element 230 can be connected without being broken.

In the same manner as in the first exemplary embodiment of the present disclosure described above, the undercut UC structure can be disposed in the vertical direction between the plurality of sub-pixels R, G, and B, and the trench T structure can be disposed in the horizontal direction between the plurality of sub-pixels R, G, and B. For example, the undercut UC structure can be disposed in the vertical direction between the plurality of third sub-pixels B and the plurality of first and second sub-pixels R and G (refer to A in FIG. 7), and at the same time, the trench T structure can be disposed in the horizontal direction between the plurality of first sub-pixels R and the plurality of second sub-pixels G (refer to B of FIG. 7). However, the present disclosure is not limited thereto.

For example, the trench T structure can be formed to extend in the horizontal direction from the undercut UC structure disposed in the vertical direction, but is not limited thereto.

The undercut UC structure can be divided into a plurality of undercut structures, but is not limited thereto.

The trench T structure can be formed in the vertical direction between the plurality of divided undercut UC structures in the vertical direction, but is not limited thereto.

The trench T structure can be patterned together with the undercut UC structure.

Figure 9:
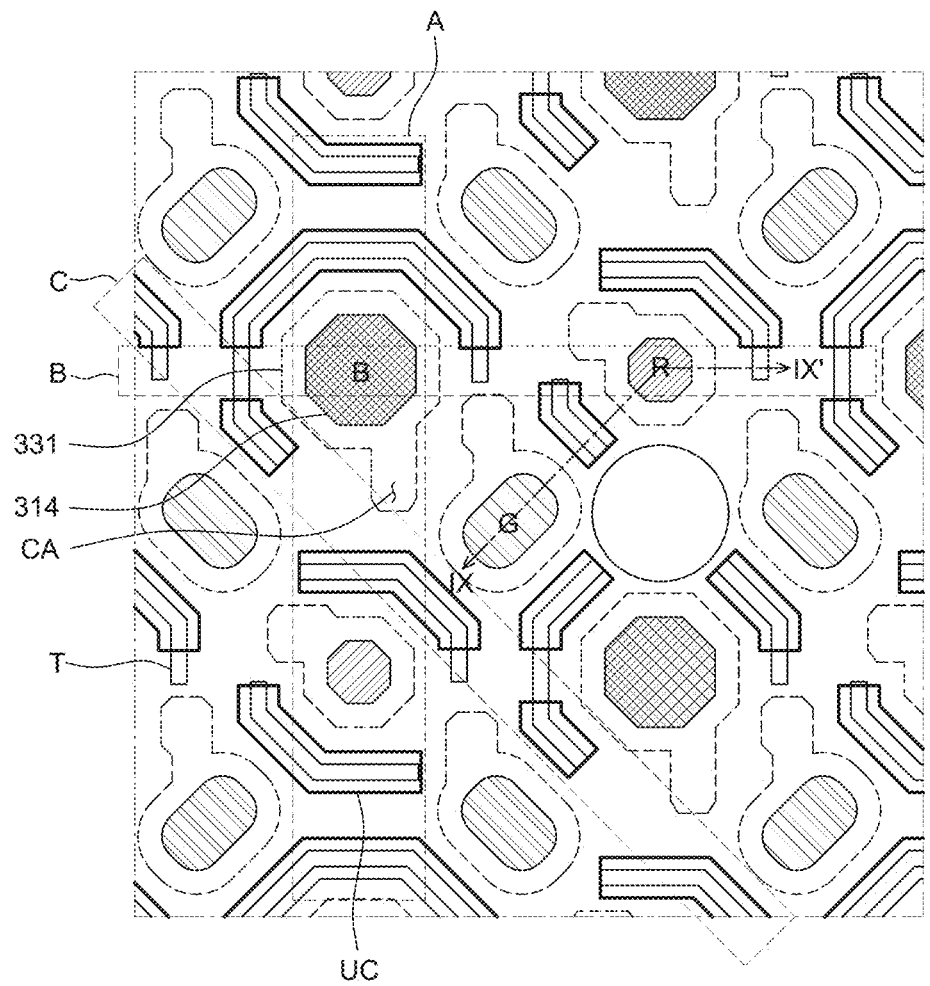
FIG. 9 is an enlarged plan view of sub-pixels of a display device according to a third exemplary embodiment of the present disclosure.

FIG. 9 is an enlarged plan view of sub-pixels of a display device according to a third exemplary embodiment of the present disclosure.

Figure 10:
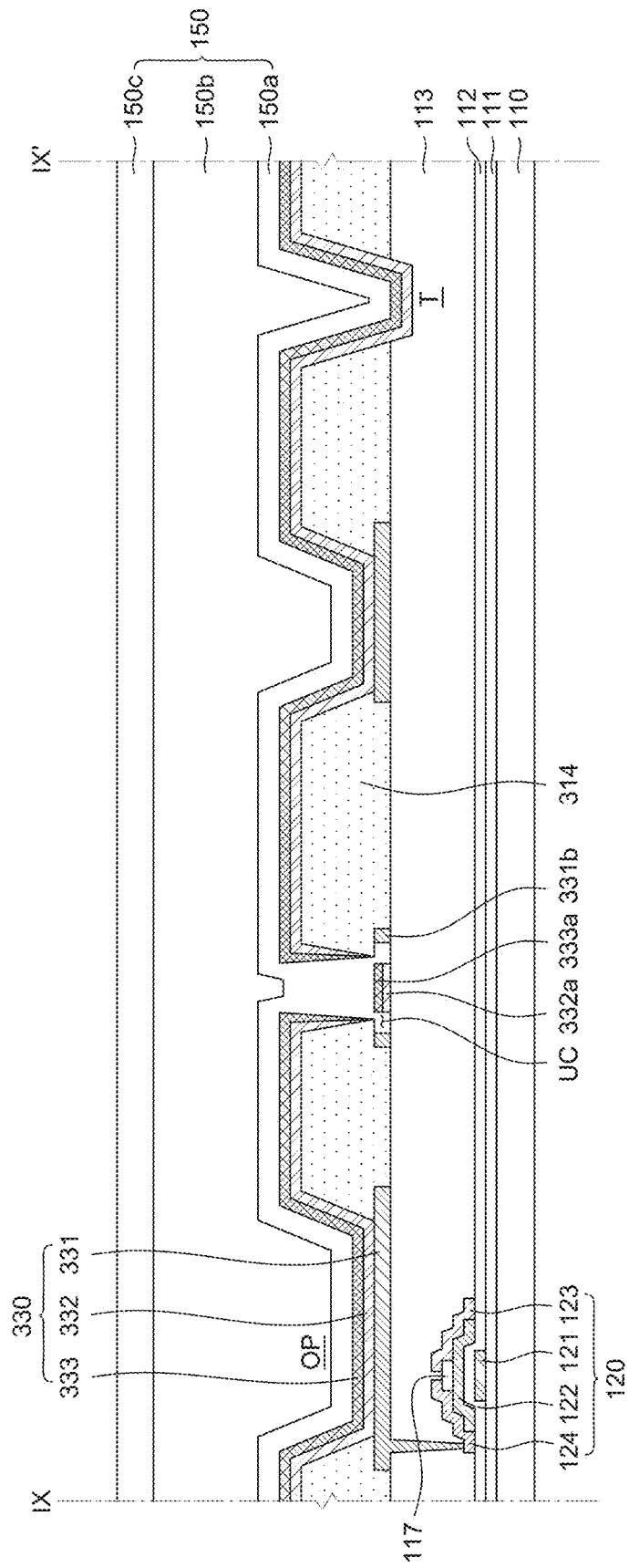
FIG. 10 is a cross-sectional view taken along line IX-IX' of FIG. 9.

FIG. 10 is a cross-sectional view taken along line IX-IX' of FIG. 9.

The third exemplary embodiment of the present disclosure shown in FIGS. 9 and 10 has substantially the same configuration as the first exemplary embodiment of the present disclosure, except for shapes of the sub-pixels R, G, and B. Therefore, redundant descriptions for the same configuration will be omitted or may be briefly provided.

For example, FIG. 9 illustrates a case in which the shapes of the sub-pixels R, G, and B are octagons or ellipses, but the present disclosure is not limited to the shapes of the sub-pixels R, G, and B.

In addition, FIG. 10 illustrates inclusion of any one transistor 120 in a cross-sectional structure of FIG. 9. And, FIG. 10 illustrates a cross-section cut across any two sub-pixels G and R in a diagonal direction and a cross-section cut across any two sub-pixels R and B in a horizontal direction.

Referring to FIGS. 9 and 10, for example, the plurality of second sub-pixels G can be disposed in the same column, and the plurality of first sub-pixels R and third sub-pixels B can be alternately disposed in the same column.

More specifically, the plurality of second sub-pixels G can be disposed in the first column, the third column, and the fifth column, and the plurality of first sub-pixels R and third sub-pixels B can be alternately disposed in the second column and the fourth column. However, the present disclosure is not limited thereto.

Further, for example, the plurality of second sub-pixels G can be disposed in the same row, and the plurality of first sub-pixels R and third sub-pixels B can be alternately disposed in the same row.

More specifically, the plurality of second sub-pixels G can be disposed in the first row, the third row, and the fifth row, and the plurality of first sub-pixels R and third sub-pixels B can be alternately disposed in the second row and the fourth row. However, the present disclosure is not limited thereto.

In addition, for example, the plurality of second sub-pixels G and third sub-pixels B can be alternately disposed in a diagonal direction, and the plurality of first sub-pixels R and second sub-pixels G can be alternately disposed in a neighboring diagonal direction. In addition, the plurality of second sub-pixels G and third sub-pixels B can be alternately disposed in another diagonal direction, and the plurality of first sub-pixels R and second sub-pixels G can be alternately disposed in another neighboring diagonal direction.

Meanwhile, in the third exemplary embodiment of the present disclosure, an undercut UC structure can be disposed in the horizontal direction and the diagonal direction between the plurality of sub-pixels R, G, and B except for a contact area CA of a first electrode 331, and at the same time, the trench T structure can be disposed in the vertical direction between the plurality of sub-pixels R, G, and B. For example, for example, an undercut UC structure can be disposed in the horizontal direction and the diagonal direction between the plurality of first sub-pixels R of and the plurality second sub-pixels G or between the plurality of third sub-pixels B and the plurality of second sub-pixels G except for the contact area CA of the first electrode 331 (refer to A and C in FIG. 9), and at the same time, the trench T structure can be disposed in the vertical direction between the plurality of second sub-pixels G (refer to B in FIG. 9). However, the present disclosure is not limited thereto.

Since the contact area CA of the first electrode 331 does not have a space for forming a conductive layer pattern, the undercut UC structure or the trench T structure may not be formed.

For example, the trench T structure can be formed to extend in the vertical direction from the undercut UC structure disposed in the diagonal direction, but is not limited thereto.

The undercut UC structure can be divided into a plurality of undercut structures, but is not limited thereto.

The trench T structure can be patterned together with the undercut UC structure.

In this manner, a display panel PN according to the third exemplary embodiment of the present disclosure is characterized in that the undercut UC structure and the trench T structure are disposed together between the plurality of sub-pixels R, G, and B.

In the undercut UC structure, a bank 314 is removed to thereby expose side surfaces of the bank 314, and the bank 314 is further removed by a predetermined distance inwardly from lower ends of the exposed side surfaces of the bank 314, whereby an undercut UC can be formed.

In the third exemplary embodiment of the present disclosure, a conductive pattern 331b that is formed of a conductive layer of the first electrode 331 remains inside the undercut UC, but is not limited thereto.

In the undercut UC structure, due to steep inclined angles of the exposed side surfaces of the bank 314 and the undercut UC structure, an organic layer pattern 332a and a second electrode pattern 333a are stacked on each other within the undercut UC structure, and each of the organic layer pattern 332a and the second electrode pattern 333a are not connected to an organic layer 332 and a second electrode 333 and are disconnected therefrom.

On the other hand, in the trench T structure, a trench T can be formed in the planarization layer 113 by removing the lower planarization layer 113 by a partial thickness, together with removing the bank 314.

In the trench T structure, the undercut UC does not exist, so that each of the organic layer 332 and the second electrode 333 of a light emitting element 330 can be connected without being broken.

Figure 11:
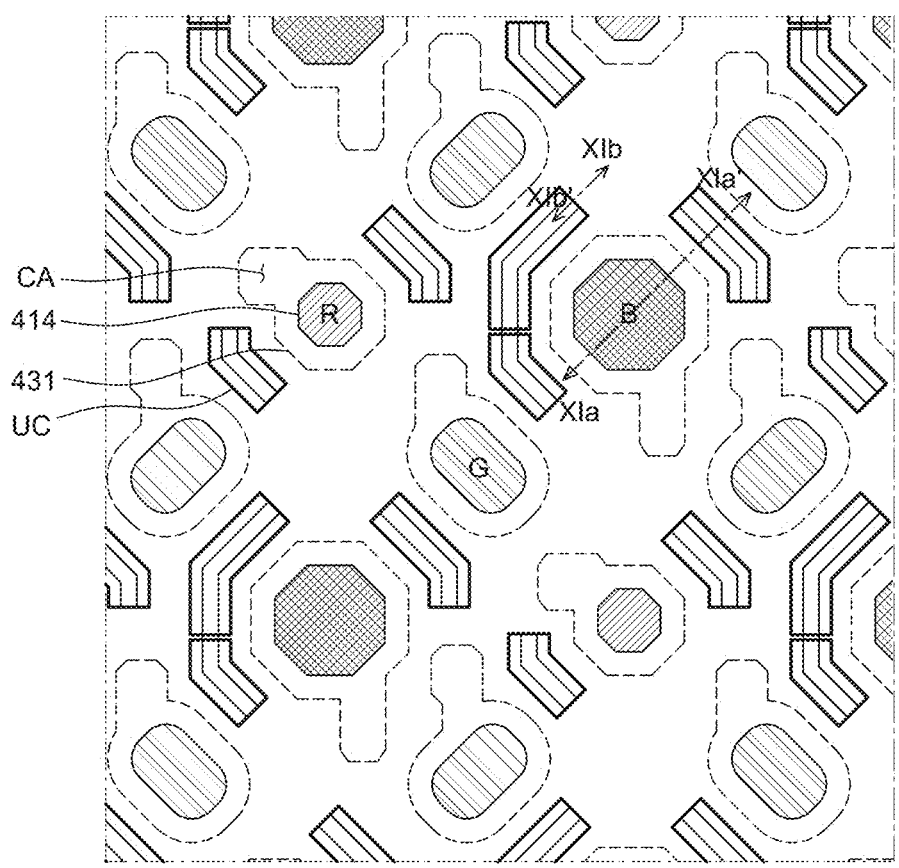
FIG. 11 is an enlarged plan view of sub-pixels of a display device according to a fourth exemplary embodiment of the present disclosure.

FIG. 11 is an enlarged plan view of sub-pixels of a display device according to a fourth exemplary embodiment of the present disclosure.

Figure 12:
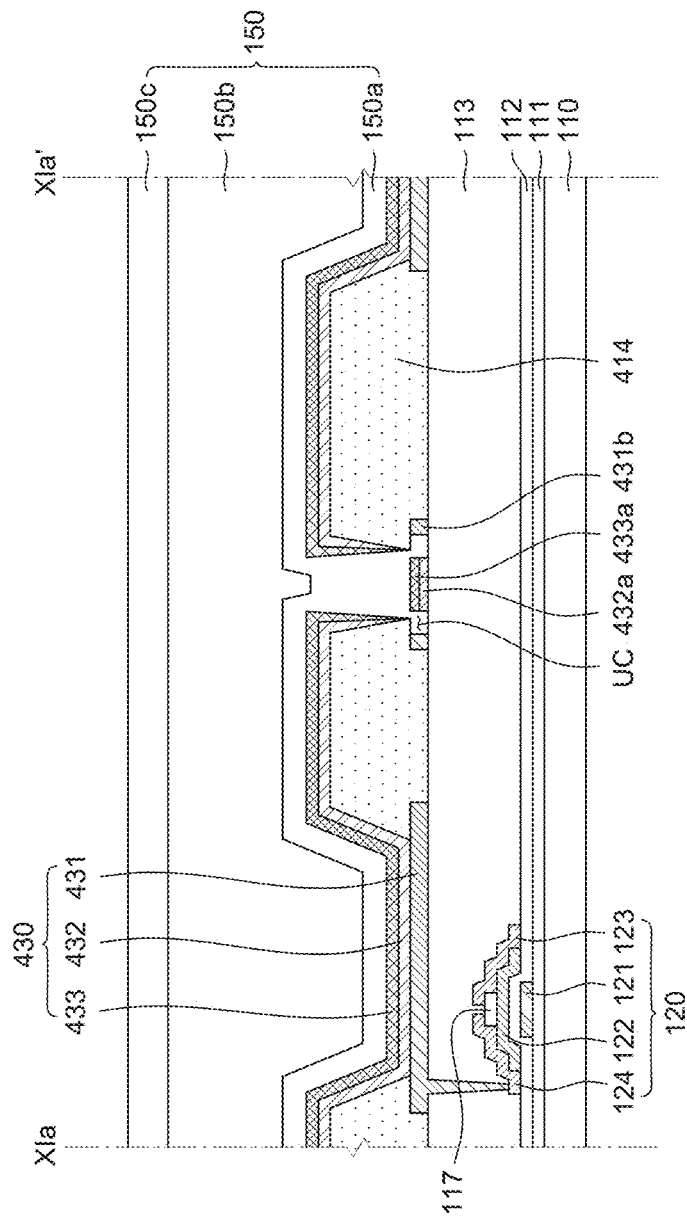
FIG. 12 is a cross-sectional view taken along line XIa-XIa' of FIG. 11.

FIG. 12 is a cross-sectional view taken along line XIa-XIa' of FIG. 11.

Figure 13:
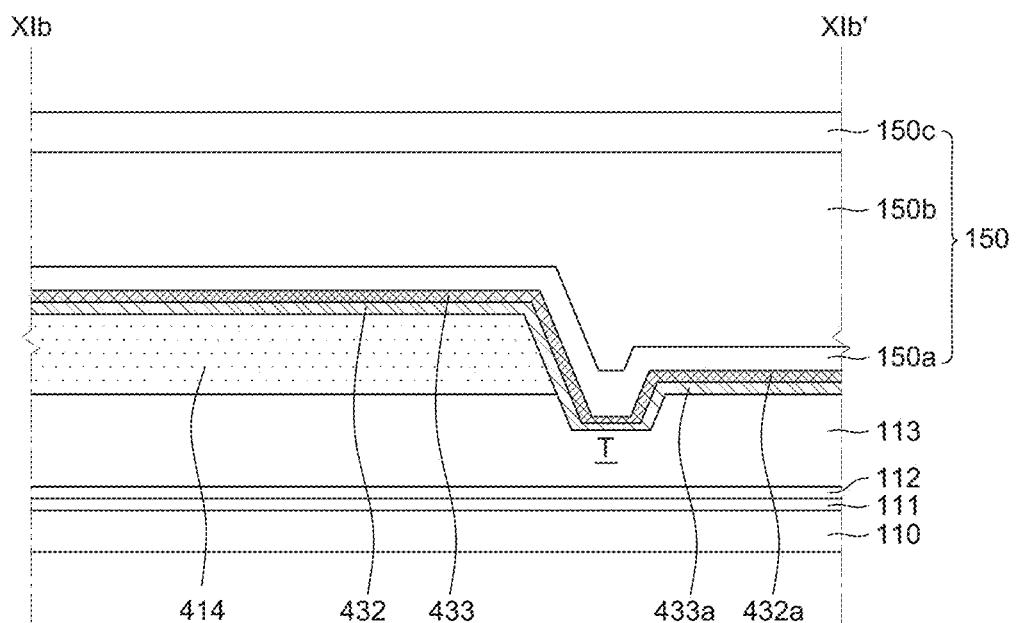
FIG. 13 is a cross-sectional view taken along line XIb-XIb' of FIG. 11.

FIG. 13 is a cross-sectional view taken along line XIb-XIb' of FIG. 11.

Figure 14A:
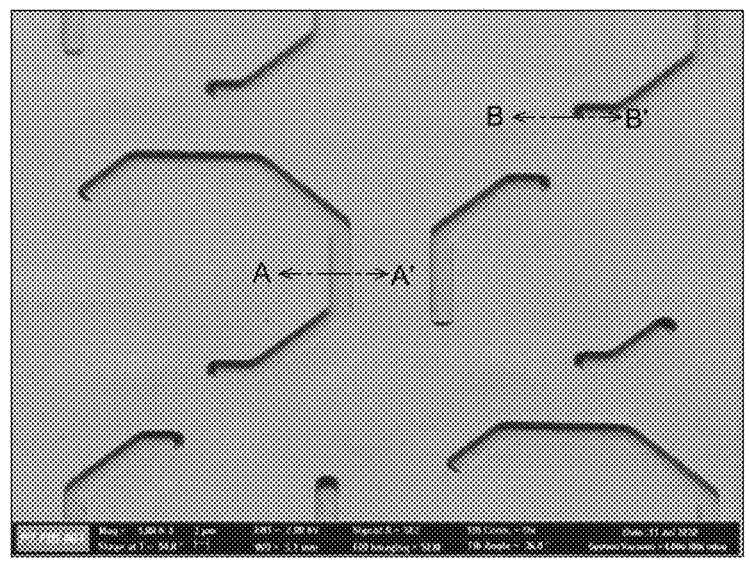
FIG. 14A is a TEM image of the sub-pixel according to the fourth exemplary embodiment of the present disclosure.

FIG. 14A is a TEM image of the sub-pixel according to the fourth exemplary embodiment of the present disclosure.

Figure 14B:
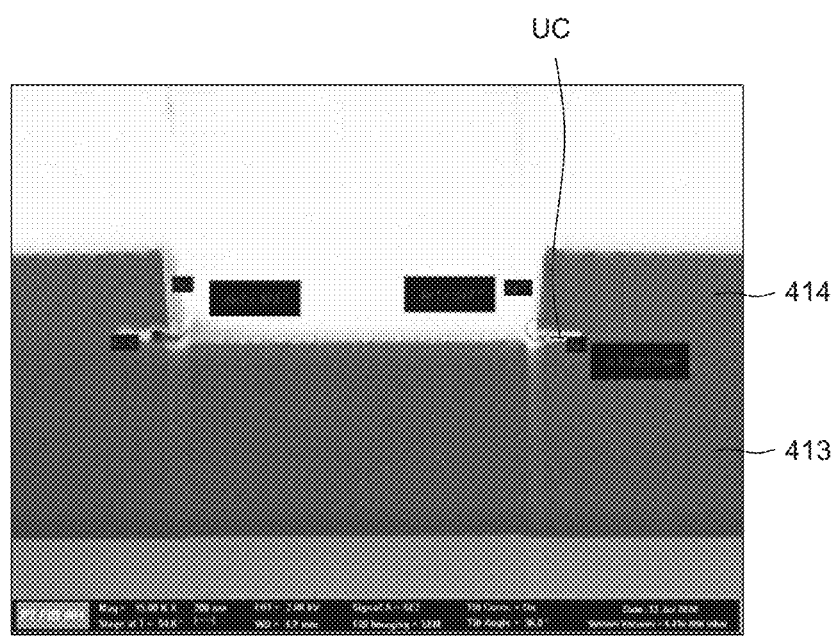
FIG. 14B is a cross-sectional image taken along line A-A' of FIG. 14A.

FIG. 14B is a cross-sectional image taken along line A-A' of FIG. 14A.

Figure 14C:
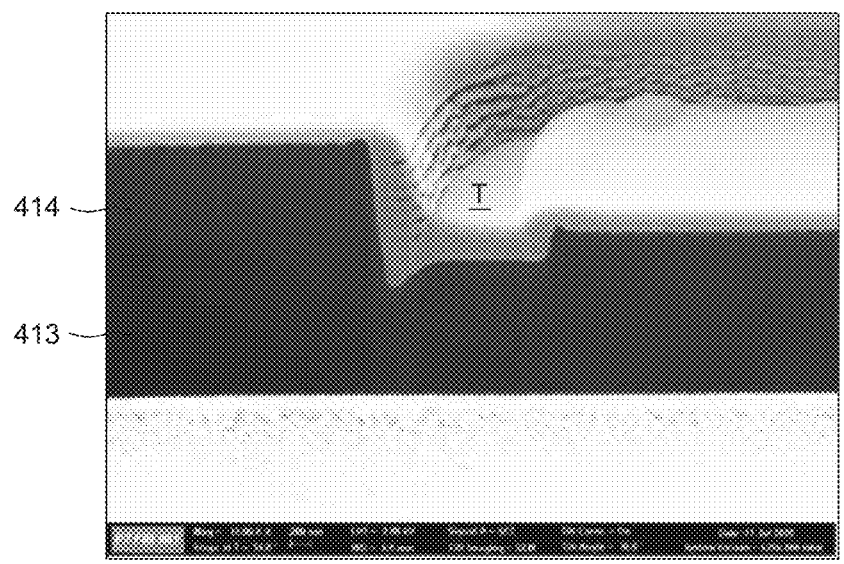
FIG. 14C is a cross-sectional image taken along line B-B' of FIG. 14A.

FIG. 14C is a cross-sectional image taken along line B-B' of FIG. 14A.

The fourth exemplary embodiment of the present disclosure shown in FIGS. 11 to 13 has substantially the same configuration as the first exemplary embodiment of the present disclosure, except for the shapes of the sub-pixels R, G, and B. Therefore, redundant descriptions for the same configuration will be omitted or may be briefly provided. In addition, the fourth exemplary embodiment of the present disclosure has substantially the same configuration as the above-described third exemplary embodiment of the present disclosure, except that a trench structure is omitted.

For example, FIG. 11 illustrates a case in which the shapes of the sub-pixels R, G, and B are octagons or ellipses, but the present disclosure is not limited to the shapes of the sub-pixels R, G, and B.

In addition, FIG. 12 illustrates inclusion of any one transistor 120 in a cross-sectional structure of FIG. 11. Further, FIG. 12 illustrates a cross-section cut across any two sub-pixels G and B in a diagonal direction and FIG. 13 illustrates a cross-section cut across an end of an undercut UC in the cross-sectional structure of FIG. 11.

FIGS. 14A and 14B each show a TEM image of an undercut UC structure according to the fourth exemplary embodiment of the present disclosure, as an example, and FIG. 14C shows a TEM image of a cross-section cut across the end of the undercut UC.

Referring to FIG. 11 to FIG. 13, for example, the plurality of second sub-pixels G can be disposed in the same column, and the plurality of first sub-pixels R and third sub-pixels B can be alternately disposed in the same column.

More specifically, the plurality of second sub-pixels G can be disposed in the first column, the third column, and the fifth column, and the plurality of first sub-pixels R and third sub-pixels B can be alternately disposed in the second column and the fourth column. However, the present disclosure is not limited thereto.

Further, for example, the plurality of second sub-pixels G can be disposed in the same row, and the plurality of first sub-pixels R and third sub-pixels B can be alternately disposed in the same row.

More specifically, the plurality of second sub-pixels G can be disposed in the first row, the third row, and the fifth row, and the plurality of first sub-pixels R and third sub-pixels B can be alternately disposed in the second row and the fourth row. However, the present disclosure is not limited thereto.

In addition, for example, the plurality of second sub-pixels G and third sub-pixels B can be alternately disposed in a diagonal direction, and the plurality of first sub-pixels R and second sub-pixels G can be alternately disposed in a neighboring diagonal direction. In addition, the plurality of second sub-pixels G and third sub-pixels B can be alternately disposed in another diagonal direction, and the plurality of first sub-pixels R and second sub-pixels G can be alternately disposed in another neighboring diagonal direction.

Meanwhile, in the fourth exemplary embodiment of the present disclosure, the undercut UC structure can be disposed in the diagonal direction between the plurality of sub-pixels R, G, and B except for a contact area CA of a first electrode 431. For example, for example, the undercut UC structure can be disposed in the diagonal direction between the plurality of first sub-pixels R of and the plurality second sub-pixels G or between the plurality of third sub-pixels B and the plurality of second sub-pixels G except for the contact area CA of the first electrode 431. However, the present disclosure is not limited thereto.

For example, a portion of the undercut UC structure in the diagonal direction can extend in the vertical direction, but is not limited thereto.

The undercut UC structure can be divided into a plurality of undercut structures, but is not limited thereto.

In this manner, a display panel PN according to the fourth exemplary embodiment of the present disclosure is characterized in that the undercut UC structure is disposed between the plurality of sub-pixels R, G, and B.

Referring to FIG. 12 and FIGS. 14A and 14B, in the undercut UC structure, a bank 414 is removed to thereby expose side surfaces of the bank 414, and the bank 414 is further removed by a predetermined distance inwardly from lower ends of the exposed side surfaces of the bank 414, whereby an undercut UC can be formed.

In the fourth exemplary embodiment of the present disclosure, a conductive pattern 431b that is formed of a conductive layer of a first electrode 431 remains inside the undercut UC, but is not limited thereto.

In the undercut UC structure, due to steep inclined angles of the exposed side surfaces of the bank 414 and the undercut UC structure, an organic layer pattern 432a and a second electrode pattern 433a are stacked on each other within the undercut UC structure, and each of the organic layer pattern 432a and the second electrode pattern 433a are not connected to an organic layer 432 and a second electrode 433 and are disconnected therefrom.

In the fourth exemplary embodiment of the present disclosure, a trench T structure is omitted, but referring to FIG. 13 and FIGS. 14A and 14B, a short trench T can be formed in the planarization layer 113 by removing a partial thickness of the planarization layer 113 from the side of the bank 414 due to a difference in etch with other areas at the end of the undercut UC structure.

However, in the trench T structure of the fourth exemplary embodiment of the present disclosure, the organic layer 432 and the second electrode 433 of a light emitting element 430 can be connected to the organic layer pattern 432a and the second electrode pattern 433a in the undercut UC structure adjacent thereto. However, the present invention is not limited thereto.

For example, the organic layer 432 and the second electrode 433 in the trench T structure can have a thickness of 20% to 30% and 50% of a thickness of each of the organic layer pattern 432a and the second electrode pattern 433a in other areas, for example, in the undercut UC structure, but the present disclosure is not limited thereto.

In the fourth exemplary embodiment of the present disclosure, since the forming of the trench T structure is not intentionally made compared to other embodiments, there is an advantage in that a process is simple.

The exemplary embodiments of the present disclosure can also be described as follows:

According to an aspect of the present disclosure, there is provided a display device. The display device includes a substrate in which an emission area and a non-emission area are divided and a plurality of sub-pixels are defined; an insulating layer disposed on the substrate; a first electrode disposed in each of the plurality of sub-pixels; a bank disposed on the insulating layer and exposing the first electrode through an opening thereof; an organic layer disposed on the first electrode; and a second electrode disposed on the organic layer, wherein the bank can have exposed side surfaces by removing one area thereof between the plurality of sub-pixels and has an undercut structure inwardly from lower ends of the exposed side surfaces, wherein the bank can have exposed side surfaces by removing an area thereof between the plurality of sub-pixels and has a trench structure by removing a portion of a thickness of the insulating layer.

The plurality of sub-pixels can include a plurality of first sub-pixels that emit light of a first color; a plurality of second sub-pixels that emit light of a second color; and a plurality of third sub-pixels that emit light of a third color.

The first color can be red, the second color can be green, and the third color can be blue.

The display device can further include a conductive pattern disposed inside the undercut structure and formed of a conductive material constituting the first electrode.

The display device can further include an organic layer pattern and a second electrode pattern disposed in the undercut structure and formed of an organic material and a conductive material constituting the organic layer and the second electrode, respectively, wherein each of the organic layer pattern and the second electrode pattern can be disconnected from the organic layer and the second electrode.

The organic layer and the second electrode can be connected, in the trench structure.

The plurality of third sub-pixels can be disposed in the same column, the plurality of first sub-pixels and the plurality of second sub-pixels can be alternately disposed in the same column, and the first sub-pixel and the second sub-pixel can be disposed on a left and a right of the third sub-pixel.

The plurality of third sub-pixels and the plurality of first and second sub-pixels can be alternately disposed in a horizontal direction, and the plurality of third sub-pixels can be repeatedly disposed or the plurality of first sub-pixels and the plurality of second sub-pixels can be alternately disposed in a vertical direction.

The undercut structure can be disposed in the vertical direction between the plurality of sub-pixels, and the trench structure can be disposed in the horizontal direction between the plurality of sub-pixels.

The undercut structure can be disposed in the vertical direction between the plurality of third sub-pixels and the plurality of first and second sub-pixels, and the trench structure can be disposed in the horizontal direction between the plurality of first sub-pixels and the plurality of second sub-pixels.

The trench structure can be disposed to extend in the horizontal direction from the undercut structure disposed in the vertical direction.

The undercut structure can be divided into a plurality of undercut structures, wherein the display device can further include another trench structure disposed in the vertical direction between the plurality of divided undercut structures in the vertical direction.

An inclined angle of the side surfaces of the bank above the undercut structure can be relatively greater than an inclined angle of the side surfaces of the bank in the emission area.

The plurality of second sub-pixels can be disposed in the same column and the plurality of first sub-pixels and the plurality of third sub-pixels can be alternately disposed in the same column, and the plurality of second sub-pixels can be disposed in the same row and the plurality of first sub-pixels and the plurality of third sub-pixels can be alternately disposed in the same row.

The plurality of second sub-pixels and the plurality of third sub-pixels can be alternately disposed in a diagonal direction, and the plurality of first sub-pixels and the plurality of second sub-pixels can be alternately disposed in a neighboring diagonal direction.

The plurality of second sub-pixels and the plurality of third sub-pixels can be alternately disposed in another diagonal direction, and the plurality of first sub-pixels and the plurality of second sub-pixels can be alternately disposed in another neighboring diagonal direction.

The undercut structure can be disposed in a horizontal direction and a diagonal direction between the plurality of sub-pixels except for a contact area of the first electrode, and the trench structure can be disposed in a vertical direction between the plurality of sub-pixels except for the contact area of the first electrode.

The undercut structure can be disposed in the horizontal direction and the diagonal direction between the plurality of first sub-pixels and the plurality of second sub-pixels or between the plurality of third sub-pixels and the plurality of second sub-pixels except for the contact area of the first electrode, and the trench structure can be disposed in the vertical direction between the plurality of second sub-pixels except for the contact area of the first electrode.

The trench structure can be disposed to extend in the vertical direction from the undercut structure in the diagonal direction.

The display device can further include another trench structure disposed at an end of the undercut structure and provided by removing a partial thickness of the insulating layer from the side of the bank.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a substrate in which an emission area and a non-emission area are divided and a plurality of sub-pixels are defined;
   an insulating layer disposed on the substrate;
   a first electrode disposed in each of the plurality of sub-pixels;
   a bank disposed on the insulating layer and including an opening through which the first electrode is exposed;
   an organic layer disposed on the first electrode; and
   a second electrode disposed on the organic layer,
   wherein the bank includes a first type of hole between a first pair of adjacent sub-pixels among the plurality of sub-pixels, the first type of hole including an undercut structure that extends inward from lower ends of opposite sides of the first type of hole,
   wherein the bank includes a second type of hole between a second pair of adjacent sub-pixels among the plurality of sub-pixels, the second type of hole including a trench structure that extends at least partially into an upper surface of the insulating layer,
   wherein the organic layer is disconnected at the undercut structure of the first type of hole, and
   wherein the organic layer extends continuously across the trench structure of the second type of hole.

2. The display device of claim 1, wherein the plurality of sub-pixels include:
   a plurality of first sub-pixels configured to emit light of a first color;
   a plurality of second sub-pixels configured to emit light of a second color; and
   a plurality of third sub-pixels configured to emit light of a third color.

3. The display device of claim 1, further comprising:
   a conductive pattern disposed inside the undercut structure of the bank, and formed of a conductive material constituting the first electrode.

4. The display device of claim 2, wherein the plurality of third sub-pixels are disposed in a same column,
   the plurality of first sub-pixels and the plurality of second sub-pixels are alternately disposed in a same column, and
   a first sub-pixel among the plurality of first sub-pixels and a second sub-pixel among the plurality of second sub-pixels are disposed respectively on two opposite sides of a third sub-pixel among the plurality of third sub-pixels.

5. The display device of claim 4, wherein the plurality of third sub-pixels and the plurality of first and second sub-pixels are alternately disposed in a horizontal direction, and
   the plurality of third sub-pixels are repeatedly disposed or the plurality of first sub-pixels and the plurality of second sub-pixels are alternately disposed in a vertical direction.

6. The display device of claim 5, wherein the undercut structure of the bank is disposed in the vertical direction between the plurality of sub-pixels, and
   the trench structure of the bank is disposed in the horizontal direction between the plurality of sub-pixels.

7. The display device of claim 6, wherein the undercut structure is disposed in the vertical direction between the plurality of third sub-pixels and the plurality of first and second sub-pixels, and
   the trench structure is disposed in the horizontal direction between the plurality of first sub-pixels and the plurality of second sub-pixels.

8. The display device of claim 7, wherein the trench structure is disposed to extend in the horizontal direction from the undercut structure disposed in the vertical direction.

9. The display device of claim 7, wherein the undercut structure is divided into a plurality of undercut structures, and
   wherein the display device further includes another trench structure disposed in the vertical direction between the plurality of divided undercut structures in the vertical direction.

10. The display device of claim 1, wherein an inclined angle of the side surfaces of the bank above the undercut structure is relatively greater than an inclined angle of the side surfaces of the bank in the emission area.

11. The display device of claim 2, wherein the plurality of second sub-pixels are disposed in a same column,
    the plurality of first sub-pixels and the plurality of third sub-pixels are alternately disposed in a same column,
    the plurality of second sub-pixels are disposed in a same row, and
    the plurality of first sub-pixels and the plurality of third sub-pixels are alternately disposed in a same row.

12. The display device of claim 11, wherein the plurality of second sub-pixels and the plurality of third sub-pixels are alternately disposed in a diagonal direction, and
    the plurality of first sub-pixels and the plurality of second sub-pixels are alternately disposed in a neighboring diagonal direction.

13. The display device of claim 12, wherein the plurality of second sub-pixels and the plurality of third sub-pixels are alternately disposed in another diagonal direction, and
    the plurality of first sub-pixels and the plurality of second sub-pixels are alternately disposed in another neighboring diagonal direction.

14. The display device of claim 13, wherein the undercut structure of the bank is disposed in a horizontal direction and a diagonal direction between the plurality of sub-pixels except for a contact area of the first electrode, and
    the trench structure of the bank is disposed in a vertical direction between the plurality of sub-pixels except for the contact area of the first electrode.

15. The display device of claim 14, wherein the undercut structure is disposed in the horizontal direction and the diagonal direction between the plurality of first sub-pixels and the plurality of second sub-pixels or between the plurality of third sub-pixels and the plurality of second sub-pixels except for the contact area of the first electrode, and
    the trench structure is disposed in the vertical direction between the plurality of second sub-pixels except for the contact area of the first electrode.

16. The display device of claim 15, wherein the trench structure is disposed to extend in the vertical direction from the undercut structure in the diagonal direction.

17. The display device of claim 1, wherein the first type of hole in the bank extends along a first direction in a plan view, and
    wherein the second type of hole in the bank extends along a second direction in the plan view, the second direction being different than the first direction.

18. The display device of claim 17, wherein the first direction is perpendicular to the second direction.

19. The display device of claim 1, wherein the first pair of sub-pixels includes a blue sub-pixel and one of a red sub-pixel or a green sub-pixel, and
    wherein the second pair of sub-pixels includes a red sub-pixel and a green sub-pixel.

20. The display device of claim 1, wherein the first type of hole in the bank at least partially overlaps with or is in communication with the second type of hole in the bank.

* * * * *